United States Patent
Ogura

(10) Patent No.: US 10,871,794 B2
(45) Date of Patent: Dec. 22, 2020

(54) VOLTAGE REGULATOR CIRCUITRY

(71) Applicants: Kabushiki Kaisha Toshiba, Tokyo (JP); Toshiba Electronic Devices & Storage Corporation, Tokyo (JP)

(72) Inventor: Akio Ogura, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 10 days.

(21) Appl. No.: 16/298,067

(22) Filed: Mar. 11, 2019

(65) Prior Publication Data
US 2020/0064876 A1 Feb. 27, 2020

(30) Foreign Application Priority Data

Aug. 24, 2018 (JP) ................................. 2018-157222

(51) Int. Cl.
*G05F 1/575* (2006.01)
*H03F 3/45* (2006.01)
*G05F 1/59* (2006.01)

(52) U.S. Cl.
CPC ............... *G05F 1/575* (2013.01); *G05F 1/59* (2013.01); *H03F 3/4521* (2013.01); *H03F 3/45273* (2013.01)

(58) Field of Classification Search
CPC .......... G05F 1/575; G05F 1/59; H03F 3/4521; H03F 3/45273; H02M 2001/0025
See application file for complete search history.

(56) References Cited

U.S. PATENT DOCUMENTS

| | | | |
|---|---|---|---|
| 7,274,180 B2 | 9/2007 | Itoh | |
| 2005/0162210 A1* | 7/2005 | Tanzawa | G06G 7/14 327/352 |
| 2007/0108958 A1* | 5/2007 | Minakuchi | G05F 1/575 323/316 |
| 2009/0108822 A1* | 4/2009 | Hoshino | G05F 1/575 323/274 |
| 2013/0069607 A1* | 3/2013 | Suzuki | G05F 1/575 323/271 |
| 2015/0355654 A1* | 12/2015 | Ueno | G05F 1/575 323/281 |
| 2017/0205840 A1 | 7/2017 | Ogura | |

FOREIGN PATENT DOCUMENTS

| | | |
|---|---|---|
| JP | H05-127761 A | 5/1993 |
| JP | 2005-242665 A | 9/2005 |
| JP | 2008-146576 A | 6/2008 |
| JP | 4353826 B2 | 10/2009 |
| JP | 2017-126259 A | 7/2017 |

* cited by examiner

*Primary Examiner* — Kyle J Moody
*Assistant Examiner* — Lakaisha Jackson
(74) *Attorney, Agent, or Firm* — White & Case LLP

(57) ABSTRACT

Voltage regulator circuitry includes a first element, a second element, an amplifier and a reference voltage source. The first element converts an input voltage and outputs a predetermined output voltage. The second element outputs a current in proportion to a current based on the outputted voltage from the first element. The amplifier amplifies a differential voltage between a reference voltage and a voltage in proportion to the output voltage, the amplifier which controls the first element based on the differential voltage. The reference voltage source outputs the reference voltage which adapts to a comparison between the current outputted from the second element and a reference current.

18 Claims, 7 Drawing Sheets

VOLTAGE REGULATOR CIRCUITRY

CROSS REFERENCE TO RELATED APPLICATIONS

This application is based upon and claims the benefit of priority from the prior Japanese Patent Application No. 2018-157222, filed on Aug. 24, 2018, the entire contents of which are incorporated herein by reference.

FIELD

The embodiments of the present invention relate to voltage regulator circuitry.

Background

In an electronic apparatus, various devices such as a microcomputer, a sensor, and a driver exist, and it is necessary to supply an appropriate power supply voltage to each of the devices. For this supply, circuits such as various regulators which output constant voltage are used. In recent years, due to an increase in portable equipment driven by a battery, a power supply circuit in which consumption current is low is required. On the other hand, characteristics such as suppression of a noise which the power supply circuit outputs and suppression of a power supply rejection ratio (PSRR) are required, but a relationship of these characteristics and a low consumption current characteristic are contrary to each other. Since a linear regulator is inexpensive and simple, it is widely used as the power supply circuit, but in order to achieve a noise reduction and an improvement in a PSRR characteristic, the noise reduction and the improvement in the PSRR characteristic of a reference voltage VREF itself included in the inside thereof are required.

DETAILED DESCRIPTION

Figure 1:
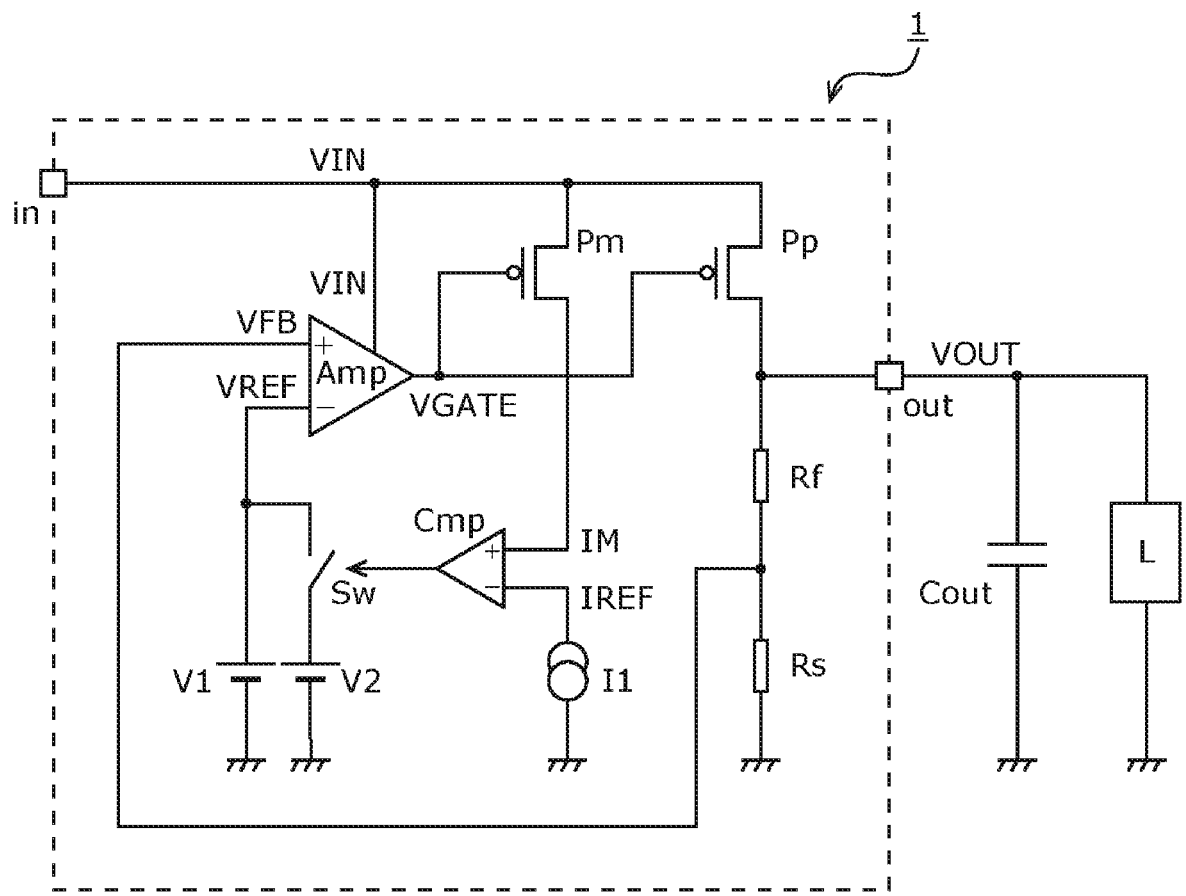
FIG. 1 illustrates an example of voltage regulator circuitry according to one embodiment.

According to one embodiment, voltage regulator circuitry includes a first element, a second element, an amplifier and a reference voltage source. The first element converts an input voltage and outputs a predetermined output voltage. The second element outputs a current in proportion to a current based on the outputted voltage from the first element. The amplifier amplifies a differential voltage between a reference voltage and a voltage in proportion to the output voltage, the amplifier which controls the first element based on the differential voltage. The reference voltage source outputs the reference voltage which adapts to a comparison between the current outputted from the second element and a reference current.

Embodiments will now be explained with reference to the accompanying drawings. The present invention is not limited to the embodiments.

In the drawings to be referred to, the same codes or similar codes are given the same portions or portions having similar functions and duplicated explanation thereof may be omitted. Further, the dimensional ratios in the drawings may be different from the actual ratios for convenience of explanation and a part of the configuration may be omitted from the drawing.

First Embodiment

FIG. 1 is a circuitry diagram illustrating an example of voltage regulator circuitry 1 according to a first embodiment. By applying an input voltage VIN (for example, Vdd) to an input terminal in, a predetermined output voltage VOUT is outputted from an output terminal out. A load L using an output capacitor Cout and an output voltage VOUT is connected to the output terminal out. A state of this load L also affects the output voltage VOUT, but the output voltage VOUT is controlled so as to become close to a predetermined value by the voltage regulator circuitry 1. As necessary, a not-illustrated input capacitor Cin may be connected outside the voltage regulator circuitry 1.

The voltage regulator circuitry 1 includes an amplifier Amp, a first transistor Pp, a second transistor Pm, a current comparator Cmp, a reference current source I1, reference voltage sources V1, V2, a switch Sw, and resistors Rf, Rs.

The amplifier Amp compares a feedback voltage VFB and a reference voltage VREF and amplifies a difference therebetween. The first transistor Pp is a transistor which controls the output voltage VOUT, and for example, is a p-type MOSFET (Metal-Oxide-Semiconductor Field-Effect-Transistor). An output of the amplifier Amp is connected into a gate of the first transistor Pp and a gate of the second transistor Pm. An amplified differential voltage outputted from the amplifier Amp is outputted to the gate of the first transistor Pp.

In the first transistor Pp (first element), a source is connected with the input terminal in, and a drain is connected with the output terminal out. The first transistor Pp controls a current flowing from the source to the drain based on the differential voltage (a driving voltage for the first transistor Pp) being the output of the amplifier Amp which is applied to the gate, resulting in controlling the output voltage VOUT. That is, the first transistor Pp operates as an output element which converts the input voltage VIN applied to the input terminal in of the voltage regulator circuitry 1 to a predetermined voltage and outputs the converted voltage as the output voltage VOUT from the output terminal out.

The second transistor Pm (second element) is a transistor whose source is connected with the input terminal in, whose drain is connected with the current comparator Cmp, and which performs monitoring of the output voltage VOUT. The second transistor Pm is, for example, a p-type MOSFET. In the first transistor Pp and the second transistor Pm, their gates are connected with each other, and an equal driving voltage being the differential voltage amplified by the amplifier Amp is also applied to the gate of the second transistor Pm. As a result, by the voltage applied to the gate of the first transistor Pp, a monitor current IM flowing from the source to the drain of the second transistor Pm is controlled. That is, the second transistor Pm operates as a monitor element which monitors an inter-drain-source current of the first transistor Pp and outputs the monitor current proportioned to a current which the first transistor Pp outputs.

The current comparator Cmp, in which an input side is connected with the drain of the second transistor Pm and the reference current source I1, outputs a signal which controls the reference voltage VREF by comparing the monitor current IM and a reference current IREF. The reference current IREF is generated by the reference current source I1. The reference current source I1 is, for example, a constant current source and is connected with an input of the current comparator Cmp.

The reference voltage sources V1, V2 are voltage sources which output the reference voltage VREF. For example, the reference voltage sources V1, V2 are constant voltage sources. The reference voltage source V1 is a power supply which outputs the reference voltage VREF regularly and a voltage source being low consumption current. This reference voltage source V1 is connected with an input of the amplifier Amp and regularly applies an outputted voltage as the reference voltage VREF to the amplifier Amp.

The reference voltage source V2 is connected with the switch Sw which switches on and off according to a signal outputted by the current comparator Cmp and connected to the input of the amplifier Amp via the switch Sw. The reference voltage source V2 outputs a voltage having a low noise characteristic regardless of larger consumption current than that of the reference voltage source V1. The monitor current IM which monitors the output current is compared with the reference current IREF by the current comparator Cmp, and in a case of the monitor current IM<the reference current IREF, the switch Sw is turned on to connect the reference voltage source V2 to the reference voltage VREF.

Thus, an entire reference voltage source is formed by the reference voltage source V1 and the reference voltage source V2 disposed in parallel with the reference voltage source V1. This entire reference voltage source controls and outputs the reference voltage VREF according to magnitude of the monitor current IM.

The resistors Rf, Rs are connected in series between the drain of the first transistor Pp and a ground point. An inter-source-drain current outputted by the first transistor Pp is applied to the resistors Rf, Rs, and thereby the output voltage VOUT is outputted from the output terminal out connected between the drain of the first transistor Pp and the resistor Rf. That is, the output element which outputs the output voltage VOUT is formed by the first transistor Pp and the resistors Rf, Rs.

The resistors Rf, Rs generate the feedback voltage VFB by dividing the output voltage VOUT. A point between the resistors Rf and Rs and an input of the amplifier Amp are connected, and the feedback voltage VFB is inputted to the amplifier Amp. A relationship of VOUT=VREF×(1+Rf/Rs) is established between the output voltage VOUT and the reference voltage VREF by these resistors Rf, Rs. Similarly, setting a noise component of the output voltage VOUT as VnOUT and a noise component of the reference voltage VREF as VnREF leads to VnOUT=VnREF×(1+Rf/Rs), and the noise component of the reference voltage VREF is also multiplied by a resistance value.

The amplifier Amp, to which the reference voltage VREF and the feedback voltage VFB are inputted, applies voltage to the gate of the first transistor Pp, namely, outputs a gate voltage VGATE which drives the first transistor Pp. The output voltage VOUT is controlled so as to become a predetermined voltage by feedback-controlling the output voltage VOUT by the feedback voltage VFB. That is, the amplifier Amp performs an output for controlling the driving voltage of the first transistor Pp such that a difference between the feedback voltage VFB and the reference voltage VREF becomes smaller at each timing. The first transistor Pp in which this driving voltage has been applied to the gate controls the output voltage VOUT, and accordingly, the feedback voltage VFB is controlled so as to make a voltage difference between the reference voltage VREF and the feedback voltage VFB lower, in other words, so as to make the voltage outputted by the amplifier Amp lower.

In order to reduce a noise of the output voltage VOUT, the reference voltage source V2 is connected. When the load L is not connected, it is not necessary to be low noise, and the reference voltage source V1 outputs the reference voltage VREF. In this case, the voltage regulator circuitry 1 functions as a constant voltage source being low consumption current.

On the other hand, when the load L is connected, a load current is generated. The load current decreases a current passing through the resistors Rf, Rs, to decrease the feedback voltage VFB. The decrease in the feedback voltage VFB causes a decrease in a differential voltage VFB−VREF inputted to the amplifier Amp, resulting in a decrease in a voltage outputted therefrom, namely, a voltage applied to the gate of the second transistor Pm. This increases the monitor current IM being an inter-source-drain current of the second transistor Pm. The increase in the monitor current IM causes an increase in a value of the differential current IM−IREF, turns the switch Sw on, and connects the reference voltage source V2 with the reference voltage source V1. As a result, the reference voltage VREF with low noise is inputted to the amplifier Amp regardless of larger consumption current, and the driving voltage becomes low noise, and thus the voltage regulator circuitry 1 functions as a constant voltage source which outputs the output voltage VOUT with low noise.

Hereinafter, examples of the reference voltage sources V1, V2 will be explained in detail.

Figure 2:
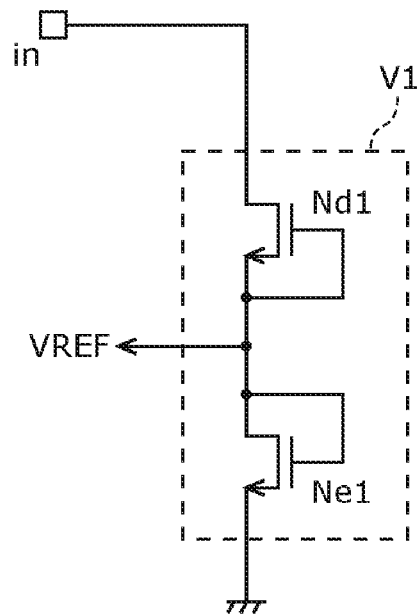
FIG. 2 illustrates an example of a reference voltage source according to one embodiment.

FIG. 2 is a circuit diagram illustrating an example of the reference voltage source V1. The reference voltage source V1 includes a transistor Nd1 and a transistor Ne1. The transistor Nd1, whose threshold voltage $V_t$ has a negative value, is a depletion-mode n-type MOSFET in which a gate and a source are connected. On the other hand, the transistor Ne1, whose threshold voltage $V_t$ has a positive value, is an enhancement-mode n-type MOSFET in which a gate and a drain are connected.

A drain of the transistor Nd1 is connected with the input terminal in. The source of the transistor Nd1 is connected with the drain of the transistor Ne1. A source of the transistor Ne1 is grounded. The reference voltage VREF is outputted from between the source of the transistor Nd1 and the drain of the transistor Ne1 connected with each other.

The reference voltage VREF outputted from the reference voltage source V1 illustrated in FIG. 2 will be explained. In general, an inter-drain-source current $I_{DS}$ in a saturation region is expressed as follows.

$$I_{DS} = \frac{\mu C_{ox}}{2} \frac{W}{L}(V_{gs} - V_t)^2 \quad (1)$$

Here, μ represents a mobility of an electron in a semiconductor, W represents a gate width (channel width), L represents a gate length (channel length), $C_{ox}$ represents a capacitance per unit area of a MOSFET capacitor, and $V_{gs}$ represents an inter-gate-source voltage, respectively.

In the depletion-mode transistor Nd1, an inter-gate-source voltage is set to "0" (zero).

$$I_{DSd} = \frac{\mu C_{oxd}}{2} \frac{W_d}{L_d} (0 - V_{td})^2 \quad (2)$$

Here, Ld represents a depletion-mode transistor gate length, and Wd represents a gate width of the depletion-mode transistor respectively.

On the other hand, in the enhancement-mode transistor Ne1, an inter-gate-source voltage is set to VREF.

$$I_{DSe} = \frac{\mu C_{oxe}}{2} \frac{W_e}{L_e} (VREF - V_{te})^2 \quad (3)$$

Here, Le represents a gate length of the enhancement-mode transistor, and We represents a gate width of the enhancement-mode transistor respectively.

In a saturated state, since a value of a current flowing between the drain and the source of each of both the transistor Nd1 and the transistor Ne1 is the same, the right sides of eq. 2 and eq. 3 can be joined by an equal sign, and an equation joined by the equal sign is solved regarding VREF, resulting in eq. 4.

$$VREF = \sqrt{\frac{\mu_d}{\mu_e} \frac{W_d/L_d}{W_e/L_e}} |V_{td}| + V_{te} \quad (4)$$

When there is no temperature dependency of the reference voltage VREF, the one obtained by partially differentiating eq. 5 with respect to a temperature T becomes "0" (zero).

[Numerical formula 5]

$$\frac{\partial VREF}{\partial T} = \sqrt{\frac{\mu_d}{\mu_e} \frac{W_d/L_d}{W_e/L_e}} \frac{\partial |V_{td}|}{\partial T} + \frac{\partial V_{te}}{\partial T} = 0 \quad (5)$$

Regarding a gate size of the transistor Nd1 and a gate size of the transistor Ne1, optimizing a relationship (Wd/Ld)/(We/Le) of Wd/Ld and We/Le allows eq. 5 to be established. Establishing eq. 5 makes it possible to set a differential value of VRET with respect to the temperature T to "0" (zero), namely, to achieve VREF having no temperature characteristic. Thus, the reference voltage source is configured so as not to change a ratio of the optimized (Wd/Ld)/(We/Le).

Figure 3:
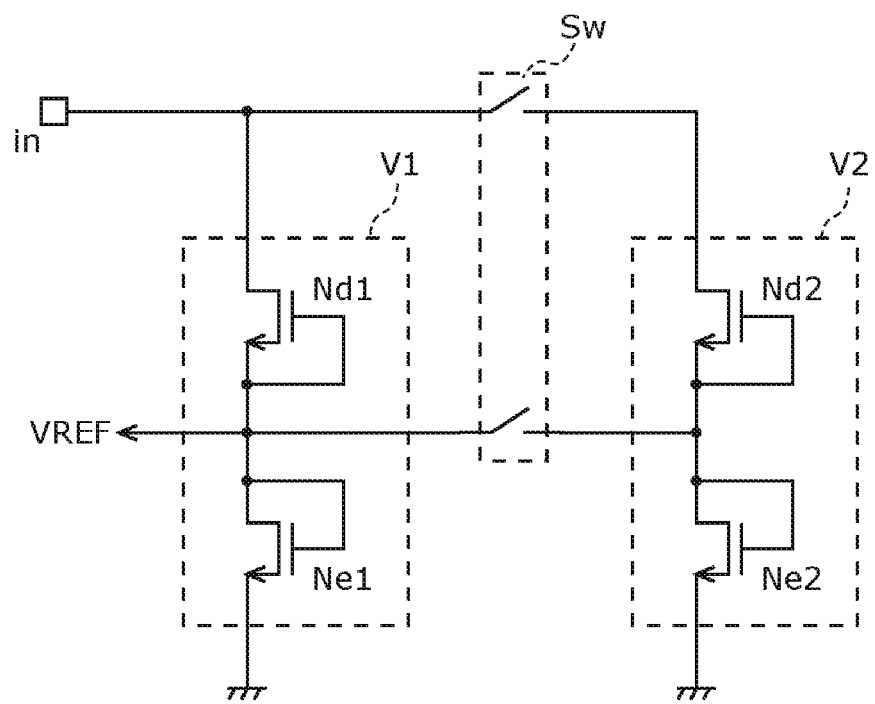
FIG. 3 illustrates an example of a low noise reference voltage source according to one embodiment.

FIG. 3 illustrates a diagram in which the reference voltage source V2 with low noise is connected with the reference voltage source V1. The reference voltage source V2 with low noise is connected in parallel with the reference voltage source V1. A switch is provided between outputs of the reference voltage sources V1, V2. Similarly, in order to reduce the consumption current in the case of no load L, an interlocked switch is also provided between the input terminal in and the drain of the transistor Nd2 of the reference voltage source V2. These interlocked switches Sw are controlled by an output of the current comparator Cmp as described above.

The reference voltage source V2 includes a transistor Nd2 and a transistor Ne2 similarly to the reference voltage source V1. The transistor Nd2, whose threshold voltage $V_t$ has a negative value, is a depletion-mode n-type MOSFET in which a gate and a source are connected. On the other hand, the transistor Ne2, whose threshold voltage $V_t$ has a positive value, is an enhancement-mode n-type MOSFET in which a gate and a drain are connected.

A drain of the transistor Nd2 is connected with the input terminal in. The source of the transistor Nd2 is connected with the drain of the transistor Ne2. A source of the transistor Ne2 is grounded. The reference voltage VREF having a characteristic of low noise is outputted from between the source of the transistor Nd2 and the drain of the transistor Ne2 connected with each other.

Thus, connecting the reference voltage source V1 whose consumption current is small and the reference voltage source V2 having the low noise characteristic via the switch Sw by the output of the current comparator Cmp allows the reference voltage VREF having the low noise characteristic to be outputted when the load is connected with the output terminal out. Hereinafter, the reference voltage sources V1, V2 will be explained by citing an example in more detail.

Regarding each of the transistors provided for the reference voltage source V1 and the reference voltage source V2, the gate length and the gate width will be explained. The reference voltage source V1 is a voltage source whose consumption current is small. Since based on eq. 1, the consumption current is in proportion to W/L, it is sufficient that W is made narrow and L is made long in the transistors provided for the reference voltage source V1. On the other hand, the reference voltage source V2 is a voltage source having the characteristic of low noise without considering the consumption current. When a noise level of the MOSFET is set to k>0, it is in proportion to $L^k/W$. Therefore, it is sufficient that W is made wide and L is made short in the transistors provided for the reference voltage source V2.

Figure 4:
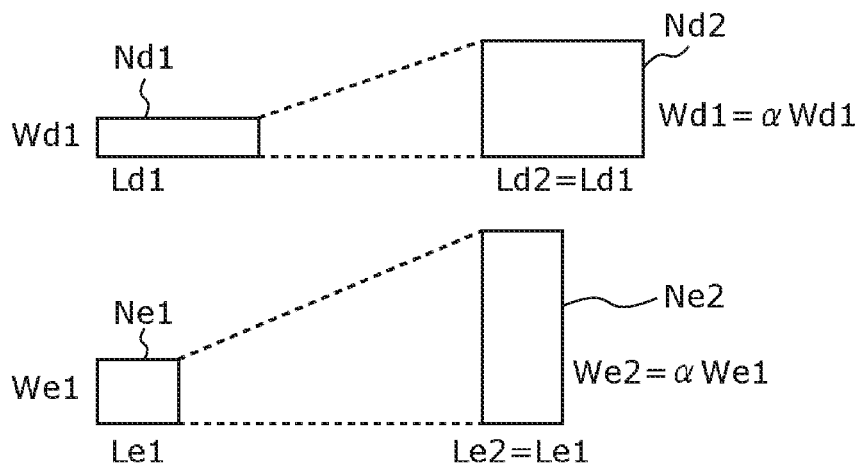
FIG. 4 and FIG. 5 each illustrate gate sizes of transistors of the reference voltage sources according to one embodiment.

FIG. 4 is a diagram illustrating relationships of the gate sizes of the transistors provided for the reference voltage sources V1, V2 according to one embodiment. The gate width of each of the transistors of the reference voltage source V2 is a times α>1) the gate width of each of the corresponding transistors of the reference voltage source V1. Thus, multiplying the gate width of each of the transistors by a factor of a makes it possible to make the gate width of each of the transistors provided for the reference voltage source V2 wider than the gate width of each of the transistors provided for the reference voltage source V1 without changing a ratio of the gate width and the gate length of each of the transistors. As compared with the reference voltage source V1, since the reference voltage source V2 has wide gate widths while having equal gate lengths, $L^k/W$ is small. Therefore, the noise level of the reference voltage source V2 is lower than the noise level of the reference voltage source V1.

Figure 5:
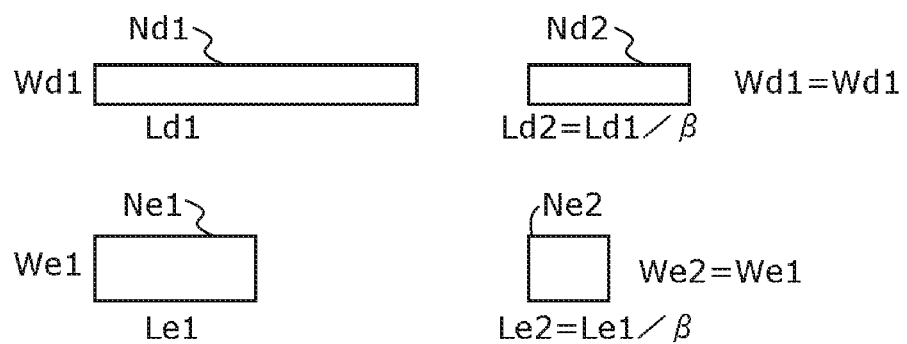

FIG. 5 is a diagram illustrating another example of the gate sizes of the transistors provided for the reference voltage sources V1, V2. The gate length of each of the transistors of the reference voltage source V2 is 1/β times (β>1) the gate length of each of the corresponding transistors of the reference voltage source V1. Thus, multiplying the gate length of each of the transistors by a factor of 1/β makes it possible to make the gate length of each of the transistors provided for the reference voltage source V2 shorter than the gate length of each of the transistors provided for the reference voltage source V1 without changing a ratio of the gate width and the gate length of each of the transistors. As compared with the reference voltage source V1, since the reference voltage source V2 has short gate lengths while having equal gate widths, $L^k/W$ is small. Therefore, the noise level of the reference voltage source V2 is lower than the noise level of the reference voltage source V1.

As in FIG. 4 and FIG. 5, setting and forming the gate size of each of the corresponding transistors of the reference voltage source V2 with respect to each of the transistors of the reference voltage source V1 allows the noise level to be decreased regardless of an increase in a consumption current amount thereof as compared with the reference voltage source V1 in the reference voltage source V2.

Note that the gate widths Wd1, We1 of the two transistors provided for the reference voltage source V1 are different from each other, but this is not restrictive. For example, as illustrated in FIG. 2, since the gates of the transistors Nd1, Ne1 are connected with each other, it is also possible to share the gates with each other and form these transistors in a semiconductor process. In such a case, by forming the transistors so as to be Wd1=We1, there is a possibility of allowing stages of the process to be decreased. This allows Wd1=We1.

Further, the above-described relationships of the sizes of the transistors are cited as examples, and these are not restrictive. Although there are cited the examples of changing only the gate width and only the gate length of each of the transistors of the reference voltage source V2 with respect to the reference voltage source V1, both of the gate width and the gate length may be changed and formed so as not to change the ratio of (Wd/Ld)/(We/Le).

As described above, according to the voltage regulator circuitry 1 according to this embodiment, by switching the switch Sw between on and off by the inter-source-drain current flowing through the second transistor Pm whose gate is connected with the gate of the first transistor Pp being an output transistor, the reference voltage source having the low noise characteristic is turned on and off, and it becomes possible to be low consumption current when the load L is not connected and output the output voltage VOUT with low noise when the load L is connected. In the above-described embodiment, even when the load L is connected, a consumption current flowing through the reference voltage source V2 is up to about several 10 μA, and therefore, in consideration of a current of about several 10 mA to several 100 mA flowing through the load L, the consumption current when the reference voltage source V2 is turned on does not have a problem very much. On the other hand, it becomes possible not to make this consumption current of several 10 μA flow regularly when the load L is not connected.

Second Embodiment

Hereinafter, implementation examples of the amplifier Amp of the voltage regulator circuitry 1 according to the aforementioned first embodiment and another implementation example of the first transistor Pp, the second transistor Pm, and the reference voltage sources V1, V2 will be explained.

Figure 6:
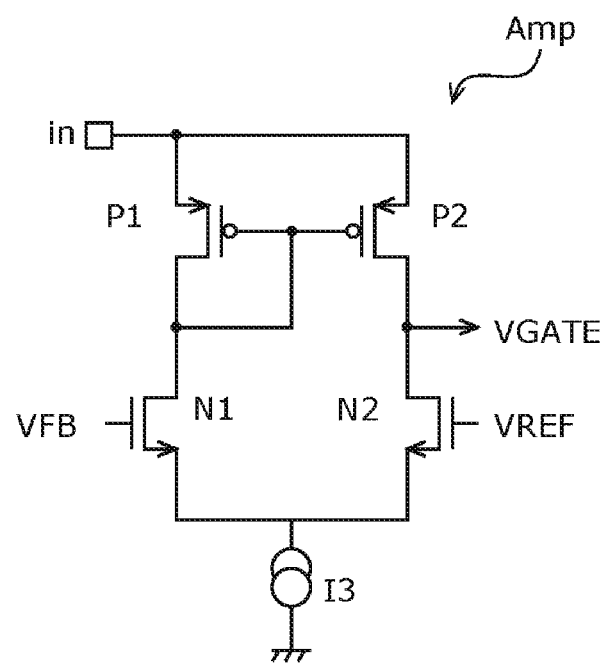
FIG. 6 to FIG. 9 each illustrate an example of an amplifier according to one embodiment.

FIG. 6 is a circuit diagram illustrating an example of an amplifier Amp according to this embodiment. The amplifier Amp includes transistors P1, P2, N1, N2 and a current source I3 as a first gain circuit. When the reference voltage VREF and the feedback voltage VFB are inputted to the amplifier Amp, it outputs the gate voltage VGATE to be applied to the gate of the first transistor Pp.

The transistors P1, P2 are, for example, p-type MOSFETs. In the transistor P1, a source is connected with the input terminal in, a drain is connected with a gate, and the gate is connected with a gate of the transistor P2. In the transistor P2, a source is connected with the input terminal in, namely, the source of the transistor P1, a gate is connected with the gate of the transistor P1, and the gate voltage VGATE is outputted from a drain. Thus, a current mirror circuit in a manner that an inter-source-drain current of the transistor P2 is equal to an inter-source-drain current of the transistor P1 is formed.

The transistors N1, N2 are, for example, n-type MOSFETs. A drain of the transistor N1 is connected with the drain of the transistor P1, and the feedback voltage VFB is applied to a gate of the transistor N1. A drain of the transistor N2 is connected with the drain of the transistor P2, and the reference voltage VREF is applied to a gate of the transistor N2. Both of sources of these transistors N1, N2 are connected with the current source I3. Thus, a differential pair circuit in which a potential at the drain of the transistor N2 becomes a voltage in proportion to VFB−VREF being a difference between the voltages applied to the gates of the transistor N1 and the transistor N2 is formed.

The stable amplifier Amp is formed by these transistors P1, P2 and transistors N1, N2. That is, the amplifier Amp is a circuit which outputs a voltage obtained by multiplying VFB−VREF by a gain as the gate voltage VGATE and functions as a differential amplifier.

Figure 7:
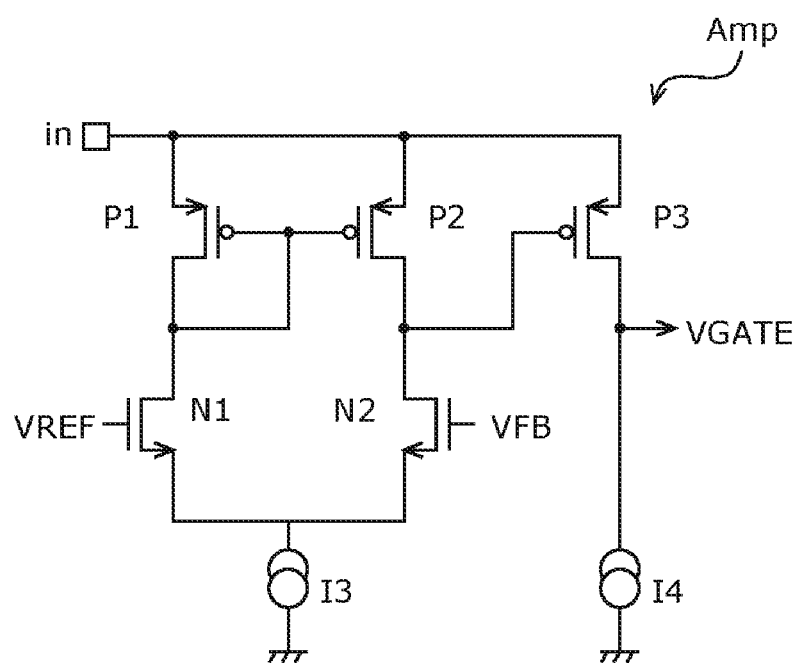

FIG. 7 illustrates an amplifier Amp which further increases the gain. The amplifier Amp, in addition to a configuration in which the first gain circuit (differential amplifier) illustrated in FIG. 6 is inverted, further includes a transistor P3 and a current source I4 as a second amplifier circuit.

The transistor P3 is, for example, a p-type MOSFET, in which a source is connected with the input terminal in, a drain is connected with the current source I4, and a gate is connected with the drain of the transistor P2 and the drain of the transistor N2, resulting in a further improvement in a gain of voltage outputted by the first gain circuit. That is, a voltage obtained by multiplying a differential voltage VREF−VFB by a gain is applied to the gate of the transistor P3. The gate voltage VGATE being the output of the amplifier Amp becomes a potential on the drain side of this transistor P3.

Thus, by further adding a second gain circuit (the transistor P3 and the current source I4) for gate driving of the first transistor Pp, a open-loop gain is increased. Because a noise and a ripple depending on the input voltage VIN are represented by 1/(1+feedback factor×open-loop gain), an improvement in an offset characteristic, a characteristic improvement in PSRR, and the like can be achieved by increasing the open-loop gain.

Figure 8:
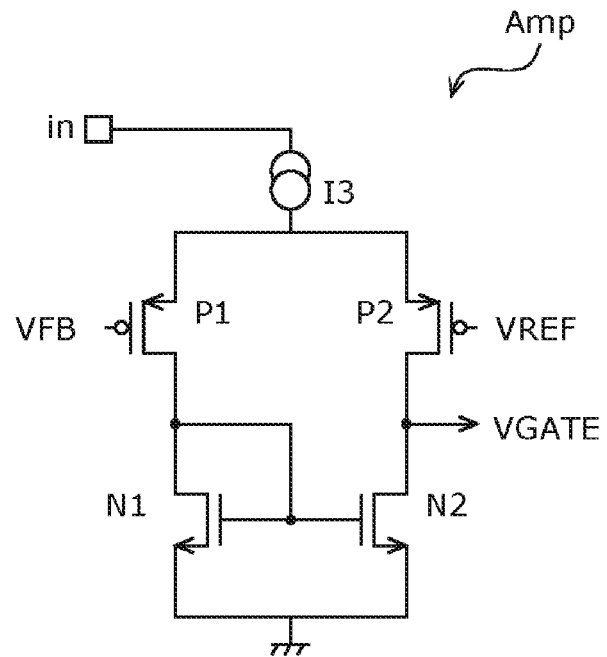

FIG. 8 is a diagram illustrating another implementation example of an amplifier Amp. The amplifier Amp includes the transistors P1, P2, N1, N2 and the current source I3. When compared with the first implementation example of the aforementioned amplifier, the transistors forming the current mirror circuit and the differential pair circuit are of opposite polarity.

In the transistor P1, the source is connected with the input terminal in via the current source I3, the drain is connected with the drain of the transistor N1, and the feedback voltage VFB is applied to the gate. In the transistor P2, the source is connected with the source of the transistor P1, the drain is connected with the drain of the transistor N2, and the reference voltage VREF is applied to the gate. In the transistor N1, the source is grounded, the drain is connected with the gate and the drain of the transistor P1, and the gate is connected with the gate of the transistor N2. In the transistor N2, the drain is connected with the drain of the transistor P2, the source is grounded, and the gate is connected with the gate of the transistor N1.

The amplifier Amp outputs drain potentials of the transistor P2 and the transistor N2 as the gate voltage VGATE. Thus, without being limited to the example in FIG. 6, the transistors can also be opposite in polarity.

Figure 9:
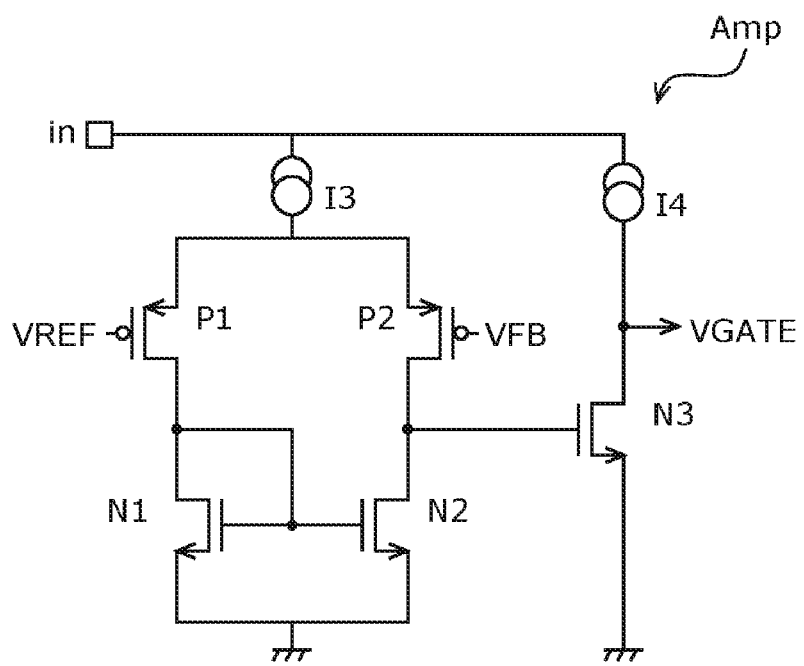

Certainly, a similar implementation is also possible for the polarity of the transistors illustrated in FIG. 7. FIG. 9 illustrates this implementation. The input voltage in FIG. 8 is reversed, and furthermore, a transistor N3 and the current source I4 are included.

The transistor N3 is, for example, an n-type MOSFET, in which a drain is connected with the input terminal in via the current source I4, a source is grounded, and a gate is connected with the drain of the transistor P2 and the drain of the transistor N2. Thus, the transistors illustrated in FIG. 7 can be opposite in polarity.

Figure 10:
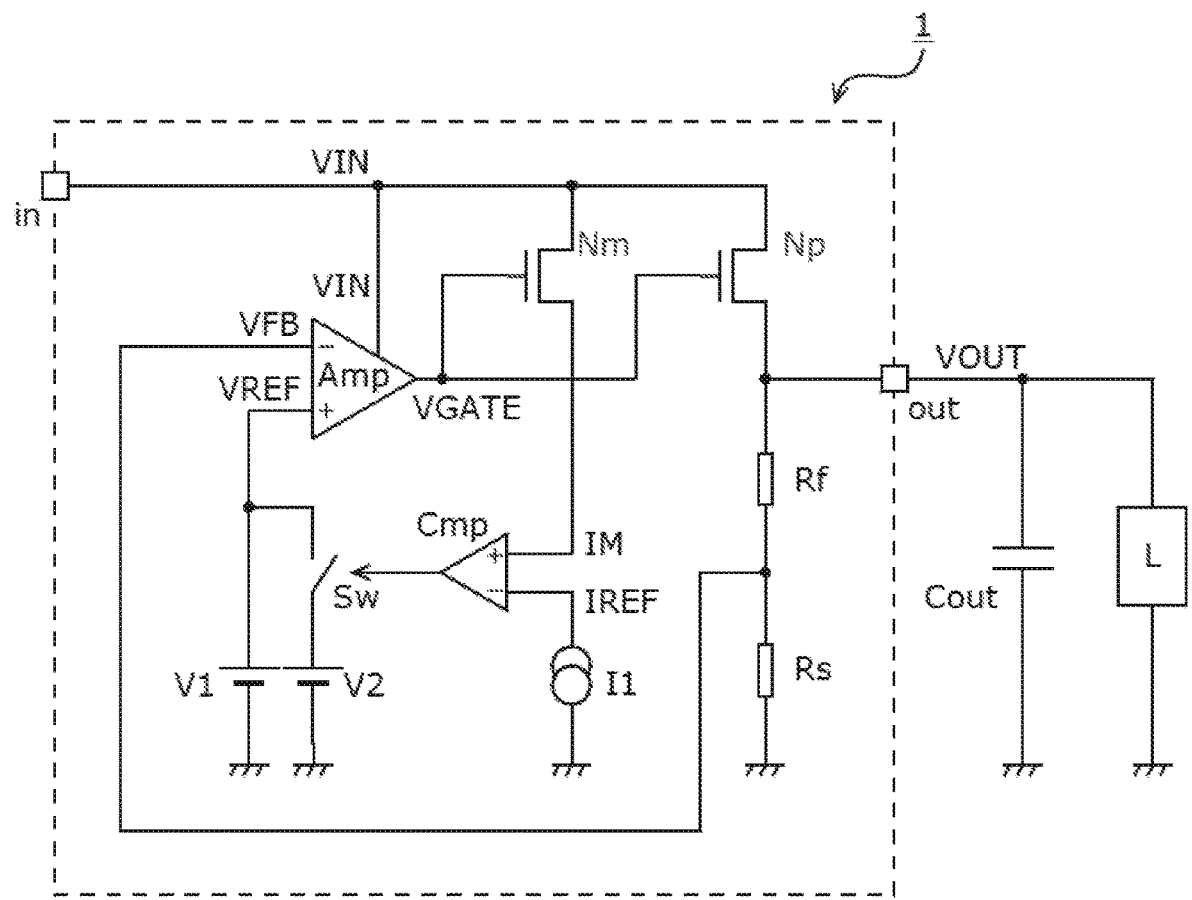
FIG. 10 illustrates an example of voltage regulator circuitry according to one embodiment.

In the polarity of the transistors, without being limited to the amplifier Amp, it is also possible to similarly change the polarity of the output transistor and the monitor transistor. FIG. 10 is a diagram illustrating an example of implementing the output transistor and the monitor transistor with n-type MOSFETs.

Voltage regulator circuitry 1 includes a third transistor Np and a fourth transistor Nm in place of the first transistor Pp and the second transistor Pm respectively. The third transistor Np is an output transistor, in which a source is connected with the resistor Rs, a drain is connected with the input terminal in, and an output voltage of the amplifier Amp is applied to a gate. The fourth transistor Nm is a monitor transistor which monitors an inter-drain-source current of the third transistor Np, in which a source is connected with the current comparator Cmp, a drain is connected with the input terminal in, and a gate is connected with the gate of the third transistor Np.

The connection as illustrated in FIG. 10 allows a similar operation to that of the voltage regulator circuitry 1 in FIG. 1. Replacing the p-type MOSFETs with the n-type MOSFETs makes it possible to expand flexibility in design or the like.

Figure 11:
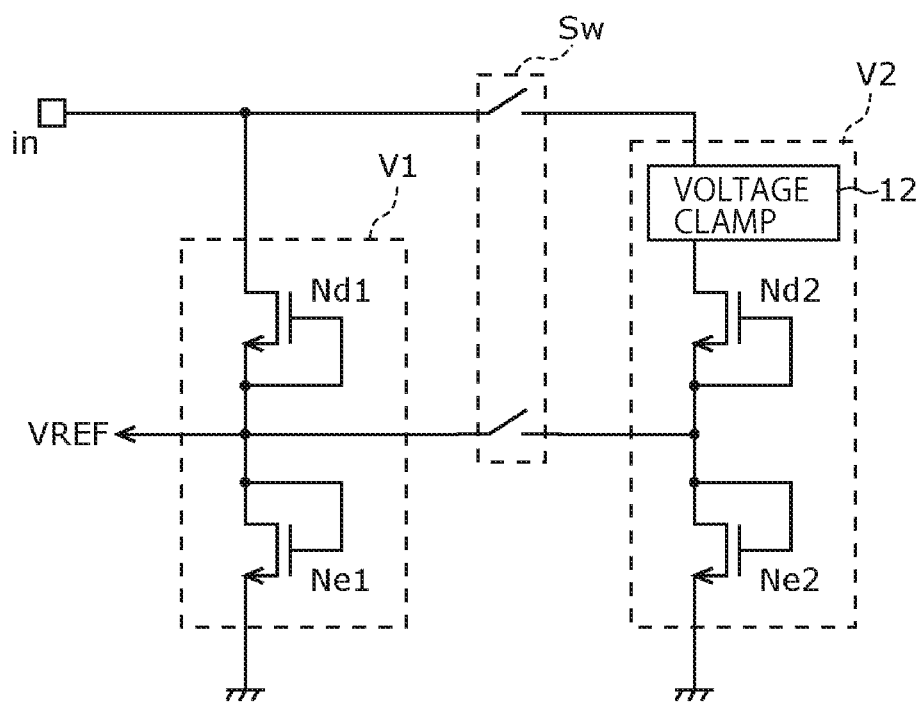
FIG. 11 illustrates an example of reference voltage sources according to one embodiment.

FIG. 11 is a diagram illustrating another implementation example regarding a reference voltage source V2. Since the reference voltage source V2 is a voltage source having the characteristic of low noise, the characteristic of the transistors included in the aforementioned embodiment is set to have low noise, but this embodiment aims at a low PSRR.

The reference voltage source V2, in addition to the transistors Nd2, Ne2 in the aforementioned embodiment, includes a voltage clamp 12. In the voltage clamp 12, an input thereto is connected with the input terminal in via the switch Sw, and an output therefrom is connected with the drain of the transistor Nd2. The voltage clamp 12 reduces a fluctuation of a voltage received from the input terminal in and outputs the voltage to the drain of the transistor Nd2. For this voltage clamp 12, the commonly used one, for example, the one formed to include voltage-regulator diodes, FETs, and the like is used.

Including the voltage clamp 12 as described above allows a ripple and a noise caused by a fluctuation of a voltage applied to the input terminal in to be reduced and allows an output as the reference voltage VREF by combining a voltage from the reference voltage source V2 with a voltage from the reference voltage source V1 when the switch Sw is turned on.

Note that the voltage clamp 12 is added, and at the same time, an adjustment of the gate sizes of the transistors Nd2, Ne2 may be made. Implementing both the configurations together makes it possible to achieve the reference voltage source V2 including a characteristic having further low noise and low ripple.

As described above, although various implementation examples are given in this embodiment, the configuration of the voltage regulator circuitry 1 according to the aforementioned embodiment is not limited to the above-described explanation.

The voltage regulator circuitry 1 according to each of the aforementioned embodiments can be used for various devices. The voltage regulator circuitry 1 is formed by using the circuits excellent in the low noise characteristic, but without being limited to this, furthermore, circuits capable of maintaining the characteristic up to a high frequency band may be used. Thus, using the circuits capable of maintaining the characteristic up to the high frequency band also makes it possible to achieve the voltage regulator circuitry including the low noise characteristic similarly in circuits which receive a voltage and a current having a high frequency, and the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in each of the aforementioned embodiments, the MOSFETs are used as the transistors, but without being limited to this, another element such as a bipolar transistor may be appropriately used. When the bipolar transistor is used, the place mentioned as the gate is replaced with a base, and the places mentioned as the drain and the source are replaced with an emitter and a collector according to circumstances, appropriately, in the explanation.

The invention claimed is:

1. Voltage regulator circuitry comprising:
   a first element which converts an input voltage and outputs a predetermined output voltage;
   a second element which outputs a second current in proportion to a first current based on the outputted voltage from the first element;
   an amplifier which amplifies a differential voltage between a reference voltage and a voltage in proportion to the output voltage, the amplifier which controls the first element based on the amplified differential voltage; and
   a reference voltage source which outputs the reference voltage which adapts to a comparison between the second current outputted from the second element and a reference current,
   wherein the reference voltage source comprises:
   a first reference voltage source which outputs a first reference voltage; and
   a second reference voltage source which connects, based on the comparison, in parallel with the first reference voltage source and outputs a second reference voltage.

2. The voltage regulator circuitry according to claim 1, wherein the reference voltage source outputs the first voltage as the reference voltage when the second reference voltage source does not connect with the first voltage source, and outputs a composite voltage of the first voltage and the second voltage when the second reference voltage source connects with the first voltage source.

3. The voltage regulator circuitry according to claim 1, wherein the reference voltage source further comprises a switch which connects an output of the second reference voltage source in parallel with an output of the first reference voltage source when the second current which the second element outputs is larger than the reference current.

4. The voltage regulator circuitry according to claim 1, wherein the first element controls the output voltage such that a voltage which the amplifier outputs becomes higher or lower than a voltage which the amplifier outputs at controlling timing.

5. The voltage regulator circuitry according to claim 1, wherein the first element comprises a first transistor which controls the first current to be outputted when the amplified differential voltage which the amplifier outputs is applied as a driving voltage, and controls the output voltage by the first current which the first transistor outputs.

6. The voltage regulator circuitry according to claim 5, wherein the second element comprises a second transistor to which the amplified differential voltage applied to the first transistor is applied and which outputs the second current.

7. The voltage regulator circuitry according to claim 6, wherein the amplifier further comprises a second gain circuit which improves a gain of an output of the first gain circuit.

8. The voltage regulator circuitry according to claim 1, wherein the second element outputs the second current in proportion to the first current which the first element outputs.

9. The voltage regulator circuitry according to claim 1, wherein the amplifier comprises a first gain circuit having a current mirror circuit and a differential pair circuit.

10. The voltage regulator circuitry according to claim 1, wherein the second reference voltage has a same level voltage as the first reference voltage.

11. Voltage regulator circuitry comprising:
a first transistor in which an input is connected with an input terminal and an output is connected with an output terminal;
a first resistor in which one terminal is connected with the output of the first transistor;
a second resistor connected between the other terminal of the first resistor and ground;
a second transistor in which an input is connected with the input terminal and a driving terminal is connected with a driving terminal of the first transistor;
a reference current source which makes a reference current flow;
a first reference voltage source which applies a first reference voltage;
a second reference voltage source in which an output is connected in parallel with the first reference voltage source and which applies a second reference voltage;
a switch provided between an output of the first reference voltage and an output of the second reference voltage;
a current comparator in which two inputs are connected with an output of the second transistor and the reference current source and an output controls the switch; and
an amplifier in which two inputs are connected with an output of the first reference voltage source and with between the first resistor and the second resistor, and an output is connected with the driving terminal of the first transistor.

12. The voltage regulator circuitry according to claim 11, wherein the first transistor controls the output voltage such that a voltage which the amplifier outputs becomes higher or lower than a voltage which the amplifier outputs at controlling timing.

13. The voltage regulator circuitry according to claim 11, wherein the first transistor controls a first current, based on the output voltage, to be outputted when a voltage which the amplifier outputs is applied as a driving voltage, and controls the output voltage by the first current which the first transistor outputs.

14. The voltage regulator circuitry according to claim 13, wherein the second transistor is applied a driving voltage equal to the driving voltage applied to the first transistor and outputs a second current base on an output voltage thereof.

15. The voltage regulator circuitry according to claim 11, wherein the second transistor outputs a second current in proportion to a first current which the first transistor outputs.

16. The voltage regulator circuitry according to claim 11, wherein the switch connects the output of the second reference voltage source in parallel with the output of the first reference voltage source when a second current which the second transistor outputs is larger than the reference current.

17. The voltage regulator circuitry according to claim 11, wherein the amplifier comprises a first gain circuit having a current mirror circuit and a differential pair circuit.

18. The voltage regulator circuitry according to claim 17, wherein the amplifier further comprises a second gain circuit which improves a gain of an output of the first gain circuit.

* * * * *